United States Patent
Sotozaki et al.

(10) Patent No.: US 6,494,985 B1
(45) Date of Patent: Dec. 17, 2002

(54) METHOD AND APPARATUS FOR POLISHING A SUBSTRATE

(75) Inventors: Hiroshi Sotozaki, Tokyo (JP); Koji Ato, Tokyo (JP)

(73) Assignee: Ebara Corporation, Tokyo (JP)

(*) Notice: Subject to any disclaimer, the term of this patent is extended or adjusted under 35 U.S.C. 154(b) by 0 days.

(21) Appl. No.: 09/434,482

(22) Filed: Nov. 5, 1999

(30) Foreign Application Priority Data

| Nov. 6, 1998 | (JP) | ................................. 10-316522 |
| May 19, 1999 | (JP) | ................................. 11-138705 |
| Aug. 24, 1999 | (JP) | ................................. 11-236776 |

(51) Int. Cl.⁷ ........................... B24B 49/00; B24B 1/00
(52) U.S. Cl. .................. 156/345.12; 451/285; 438/690; 216/88
(58) Field of Search ................ 156/345; 216/38, 216/88–90, 108, 109; 438/690–693; 451/285–288

(56) References Cited

U.S. PATENT DOCUMENTS

| 3,923,567 A | * 12/1975 | Lawrence ................... 156/7 |
| 5,616,063 A | * 4/1997 | Okumura et al. ............. 451/1 |
| 5,827,110 A | * 10/1998 | Yajima et al. ................ 451/5 |
| 5,830,045 A | 11/1998 | Togawa et al. .............. 451/288 |
| 5,989,107 A | * 11/1999 | Shimizu et al. .............. 451/57 |
| 5,996,594 A | * 12/1999 | Roy et al. ................... 134/1.3 |
| 6,050,884 A | * 4/2000 | Togawa et al. ............... 451/67 |
| 6,110,024 A | * 8/2000 | Togawa ...................... 451/285 |
| 6,116,986 A | * 9/2000 | Togawa et al. ............... 451/36 |
| 6,125,861 A | * 10/2000 | Gupta et al. ................. 134/61 |
| 6,148,463 A | * 11/2000 | Shimzu et al. ............... 15/102 |
| 6,227,950 B1 | * 5/2001 | Hempel et al. ............... 451/66 |

FOREIGN PATENT DOCUMENTS

JP       10-125641       5/1998

OTHER PUBLICATIONS

U.S. patent application Ser. No. 09/301,718.

* cited by examiner

Primary Examiner—Gregory Mills
Assistant Examiner—Sylvia R. MacArthur
(74) Attorney, Agent, or Firm—Wenderoth, Lind & Ponack L L P (57) ABSTRACT

A substrate such as a semiconductor wafer, a glass substrate, or a liquid crystal display is polished to a flat mirror finish, and then cleaning a polished substrate that is cleaned to a high degree of cleanliness. A polishing section having at least one polishing unit for performs primary polishing and secondary polishing of the substrate by pressing the substrate against a polishing surface. A cleaning section cleans the substrate which has been polished to remove particles attached to the substrate by a scrubbing cleaning. Metal ions are removed from the substrate by supplying an etching liquid.

15 Claims, 10 Drawing Sheets

METHOD AND APPARATUS FOR POLISHING A SUBSTRATE

BACKGROUND OF THE INVENTION

1. Field of the Invention

The present invention relates to a method and apparatus for polishing a substrate, and more particularly to a method and apparatus for polishing a substrate such as a semiconductor wafer, a glass substrate, or a liquid crystal display to a flat mirror finish, and then cleaning a polished substrate that requires a high degree of cleanliness.

2. Description of the Related Art

As semiconductor devices have become more highly integrated in recently years, circuit interconnections on semiconductor substrates become finer and the distances between those circuit interconnections have become smaller. One of the processes available for forming such circuit interconnections is photolithography. Though the photolithographic process can form interconnections that are at most 0.5 $\mu$m wide, it requires that surfaces on which pattern images are to be focused by a stepper be as flat as possible because the depth of focus of the optical system is relatively small.

Further, if a particle greater than the distance between interconnections exists on a semiconductor substrate, then the particle will short-circuit interconnections on the semiconductor substrate. Therefore, any undesirable particles on the semiconductor substrate have to be sufficiently smaller than the distance between interconnections on the semiconductor substrate.

Therefore, in processing the semiconductor substrate, it is important to planarize the semiconductor substrate and clean the semiconductor substrate to a high degree of cleanliness. Such a requirement holds true for the processing of other substrates including a glass substrate to be used as a mask, a liquid crystal panel, and so on.

Figure 10:
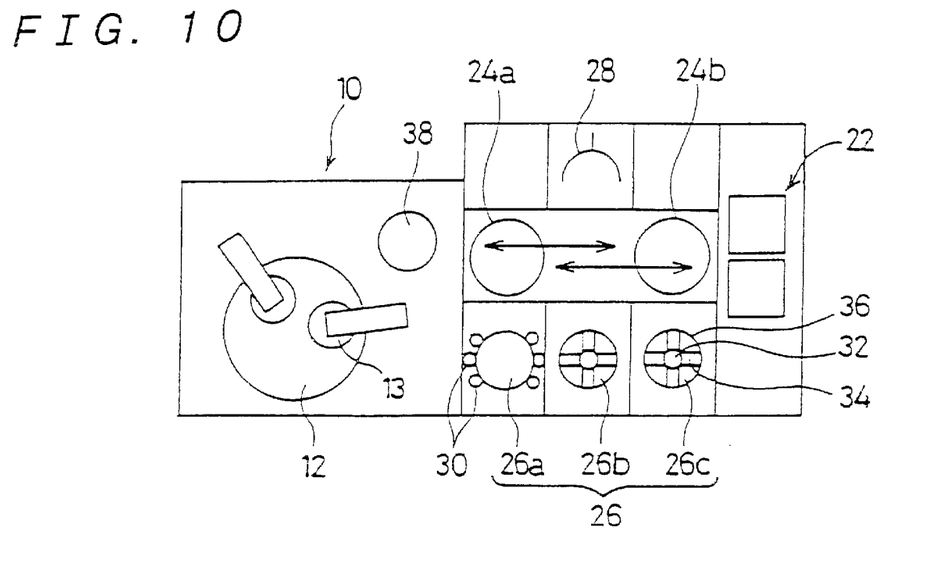
FIG. 10 is a plan view of a conventional polishing apparatus.
Figure 11:
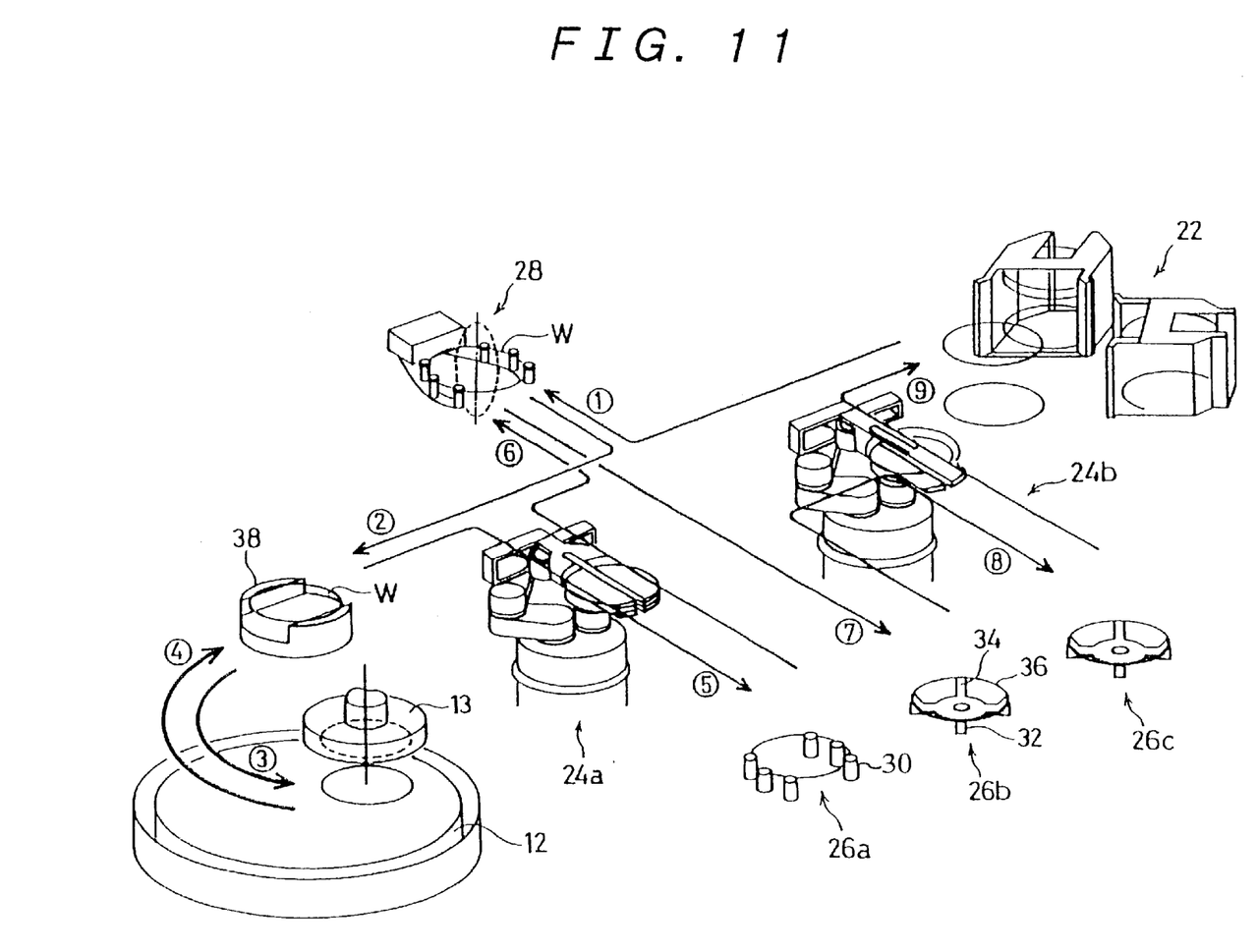
FIG. 11 is a perspective view showing the whole structure of the conventional polishing apparatus shown in FIG. 10 and the transportation route of the semiconductor substrate.

In order to achieve planarization of the semiconductor substrate, it has heretofore been customary to use a polishing apparatus, the process of which is called chemical-mechanical polishing (CMP). As shown in FIGS. 10 and 11, a conventional polishing apparatus comprises a polishing section 10, a load and unload section 22, two transfer robots 24a and 24b, a cleaning section 26 having three cleaning units 26a, 26b and 26c, and a reversing device 28 as necessary. The transfer robots 24a and 24b may be a mobile type robot which moves along rails shown in FIG. 10, or a stationary type robot having robot hands at forward ends of articulated arms shown in FIG. 11.

Figure 12:
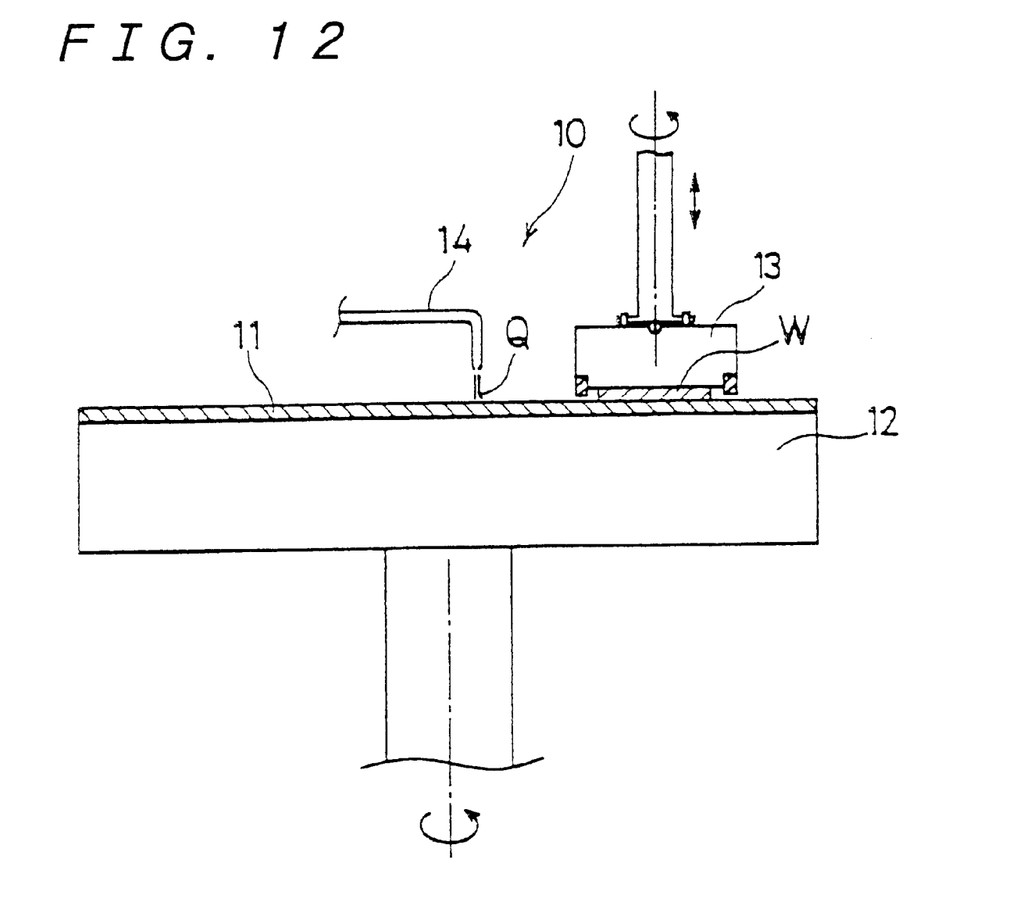
FIG. 12 is a cross-sectional view showing the structure of the polishing section in the conventional polishing apparatus.

As shown in FIG. 12, the polishing section 10 comprises a turntable 12 having a polishing cloth 11 thereon, a top ring 13 for supporting a semiconductor wafer (substrate) W and pressing the semiconductor substrate W against the turntable 12, and a nozzle 14 for supplying an abrasive liquid onto the polishing cloth 11. A transfer device 38 is disposed adjacent to the turntable 12 (FIGS. 10 and 11). The adjacent two sections are partitioned by a partition wall to prevent cross-contamination. Specifically, in order to prevent dirty atmosphere in the polishing section 10 from being scattered into a chamber in which a cleaning process and a subsequent process are performed, air conditioning and pressure regulation in each of the chambers are performed.

In the polishing apparatus having the above structure, the semiconductor substrate W is transported from the load and unload section 22 to the transfer device 38 by the transfer robots 24a and 24b and transferred to the top ring 13 by the transfer device 38. In the polishing section 10, the semiconductor substrate W is held by the lower surface of the top ring 13 and pressed against the polishing cloth 11 providing a polishing surface on the turntable 12. The abrasive liquid Q is supplied from the nozzle 14 onto the polishing cloth 11 and retained on the polishing cloth 11. During operation, the top ring 13 exerts a certain pressure on the turntable 12, and the surface of the semiconductor substrate W held against the polishing cloth 11 is therefore polished in the presence of the abrasive liquid Q between the surface of the semiconductor substrate W and the polishing surface on the polishing cloth 11 by a combination of chemical polishing and mechanical polishing while the top ring 13 and the turntable 12 are rotated. In case of polishing an insulating layer made of an oxide film ($SiO_2$) on the silicon substrate, the abrasive liquid Q contains abrasive particles having a certain diameter suspended in an alkali solution. The semiconductor substrate W which has been polished is transported to the cleaning section 26 in which the semiconductor substrate W is cleaned and dried, and then returned to the load and unload section 22.

The primary cleaning unit 26a in the cleaning section 26 has a plurality of vertical spindles 30 arranged at spaced intervals for supporting the outer circumferential edge of the semiconductor substrate W by their holding grooves formed at the upper end portions of the spindles 30 and rotating the semiconductor substrate in a horizontal plane at a relatively low rotational speed, and a pair of cleaning members comprising a roller type or a pencil type sponge which can be brought in contact with the semiconductor substrate W or out of contact with the semiconductor substrate W. The primary cleaning unit 26a is a low rotational speed type cleaning unit. The secondary and tertiary cleaning units 26b and 26c have a rotating table 36 comprising a rotating shaft 32 and a plurality of arms 34 which extend radially outwardly from the rotating shaft 32 and hold the outer circumferential edge of the semiconductor substrate W. The secondary and tertiary cleaning units 26b and 26c are a high rotational speed type cleaning unit. In each of the primary, secondary and tertiary cleaning units 26a, 26b and 26c, there are provided a nozzle for supplying a cleaning liquid to the surface of the semiconductor substrate W, a cover for preventing the cleaning liquid from being scattered around, and a ventilating equipment for creating down draft (descending air current) to prevent mist from being scattered around.

The cleaning processes for cleaning the semiconductor substrate which has been polished are carried out in the following manner:

In the primary cleaning unit 26a, while the semiconductor substrate W is held and rotated by the spindles 30, a scrubbing cleaning is performed by allowing the cleaning members to scrub the upper and lower surfaces of the semiconductor substrate W while supplying a cleaning liquid. In this scrubbing cleaning process, the first cleaning liquid having substantially the same pH as the abrasive liquid used in the polishing process is used to prevent particles from being aggregated due to so-called pH shock. To be more specific, if the abrasive liquid is rapidly diluted with pure water to lower the pH of the abrasive liquid, then the abrasive particles become unstable, to thus aggregate secondary particles to form larger aggregates. In this specification, pH shock is defined as a rapid change of a pH. Therefore, in order to prevent pH shock from occurring, the first cleaning liquid having substantially the same pH as the abrasive liquid is used in the scrubbing cleaning process. For example, in case of polishing a $SiO_2$ layer, aqueous ammonia is used as the first cleaning liquid, and after the particles are removed from the surfaces of the semiconductor substrate W, the surfaces of the semiconductor substrate are shifted from alkali to neutrality by supplying a neutral cleaning liquid such as pure water thereto. Thereafter, the semiconductor substrate W is transferred to the secondary cleaning unit 26b.

In the secondary cleaning unit 26b, in order to remove metal ions attached to the semiconductor substrate W, an acid chemical is normally supplied to the surfaces of the semiconductor substrate W from the nozzle to cause etching (chemical cleaning) of the surfaces of the semiconductor substrate, and then a neutral cleaning liquid such as pure water is supplied to cause the surfaces of the semiconductor substrate to be returned to neutrality. Thereafter, the semiconductor substrate W is transferred to the tertiary cleaning unit 26c having a drying function. In the tertiary cleaning unit 26c, pure water is supplied to perform a final cleaning of the semiconductor substrate W, and then the semiconductor substrate W is rotated at a high rotational speed while blowing a clean inert gas against the surfaces of the semiconductor substrate, thereby drying the semiconductor substrate W. After the semiconductor substrate W is cleaned and dried, the semiconductor substrate W is returned to the load and unload section 22 by a clean hand of the transfer robot 24a or 24b.

In the above-mentioned polishing apparatus, since etching cleaning is conducted by a dedicated cleaning unit, i.e., the cleaning processes are conducted by the three cleaning units 26a, 26b and 26c, the polishing apparatus becomes large, requires a large installation space, and needs a long processing time for the cleaning processes.

Further, the semiconductor substrate W is transported as shown by arrows ① to ⑨ in FIG. 11, and hence the transportation route is extremely complicated. Specifically, the semiconductor substrate is transported from the load and unload section 22 to the reversing device 28 as shown by the arrow ①, transported to the transfer device 38 as shown by the arrow ②, and then moved above the turntable 12 as shown by the arrow ③. Thereafter, the polished semiconductor substrate W is moved to the transfer device 38 as shown by the arrow ④, transported to the primary cleaning unit 26a as shown by the arrow ⑤, and then transported to the reversing device 28 as shown by the arrow ⑥. Thereafter, the semiconductor substrate W is transported to the secondary cleaning unit 26b as shown by the arrow ⑦, and then transferred to the tertiary cleaning unit 26c as shown by the arrow ⑧. Finally, the semiconductor substrate W is returned to the load and unload section 22 as shown by the arrow ⑨.

As is apparent from the above, since the transportation route is extremely complicated, the two transfer robots 24a and 24b which perform the transportation of the semiconductor substrate W are required to be controlled, while preventing the transfer robots 24a and 24b from interfering with each other. Thus, an overall system in the polishing apparatus is more complicated, and tends to retard the processing time of the semiconductor substrate. Further, as the number of times in transporting the semiconductor substrate by the robot hands increases, the chance of contamination of the semiconductor substrate increases.

In order to simplify the structure of the cleaning section 26, it is conceivable to conduct the primary cleaning process for removing particles and the secondary cleaning process for etching by the same cleaning unit. However, in this case, alkali chemicals and acid chemicals are employed as the respective cleaning liquids in the same cleaning unit, and hence the lining of a drainage system is deteriorated, salt is deposited, and waste water treatment is complicated. Alternatively, it is conceivable to conduct etching and drying of the semiconductor substrate in the secondary cleaning unit 26b. However, in this case, the semiconductor substrate W is dried in the atmosphere in which mist of the etching liquid remains, and hence the semiconductor substrate is contaminated in the final cleaning process.

SUMMARY OF THE INVENTION

It is therefore an object of the present invention to provide a method and apparatus for polishing a substrate which can reduce the scale of the polishing apparatus, shorten the processing time of the substrate, and produce a substrate having a high degree of cleanliness by performing cleaning processes with a simplified structure.

As the technology for manufacturing semiconductor devices progresses, the characteristics of layers (films) deposited on the semiconductor wafer also progresses. In the case where a semiconductor wafer having a newly developed layer (film) thereon is polished and then cleaned, the multistage cleaning of not less than three-stages is usually conducted at an early stage where the newly developed layer starts to be used in the semiconductor device manufacturing process. However, as the cleaning process progresses, the number of cleaning stages is gradually reduced. Therefore, as the process technology for manufacturing semiconductor devices progresses, the requirement for the apparatus for manufacturing the semiconductor devices changes, and hence an optimum structure of the apparatus must be maintained to meet the progress of the process technology. Therefore, the present invention is directed to provide a method and apparatus for polishing substrates with an optimum structure.

According to one aspect of the present invention, there is provided a polishing apparatus for polishing and then cleaning a substrate, the apparatus comprising: a polishing section having at least one polishing unit for performing primary polishing and secondary polishing of the substrate by pressing the substrate against a polishing surface; a cleaning section for cleaning the substrate which has been polished to remove particles attached to the substrate by scrubbing cleaning, and removing metal ions from the substrate by supplying an etching liquid.

In the secondary polishing, pure water is used as a polishing liquid, and the substrate is polished at a polishing efficiency lower than the primary polishing in such a manner that the polishing pressure and/or the polishing rate are smaller than those of the primary polishing. Thus, microscratches formed on the polished surface of the substrate in the primary polishing are removed or reduced, and ground-off particles and abrasive particles on the polished surface are removed.

For example, in case of using abrasive liquid containing siliceous material, in secondary polishing, particles on the substrate are efficiently removed by polishing the substrate under the final polishing condition. Thus, the substrate having a trace of particles thereon is transported to the cleaning section, and hence a process for removing particles by alkali can be eliminated, different from to the conventional method. In the cleaning section, etching of the surface of the substrate which is a kind of chemical cleaning using acid can be conducted, and then the substrate is cleaned and dried by a cleaning and drying process. In this manner, cleaning and drying of the substrate can be performed by two cleaning units and two processes, and thus the processing time is shortened and the number of apparatuses or units can be reduced, compared with the conventional apparatus and method. Further, the number of times of transporting the substrate is reduced, and hence the processes can be reduced and the chance of contamination of the substrate can be reduced.

It is desirable that final polishing is performed at a polishing rate of 5 Å (angstrom)/minute or below. The cleaning liquid or the etching liquid may be supplied to the front and backside surfaces of the substrate. The drying process may be performed by a drying unit different from the cleaning unit or the same cleaning unit. If the drying process is performed by the same cleaning unit, then it is desirable to perform the drying process in a clean atmosphere. As a cleaning liquid, a high performance water including ionic water, ozone water, and hydrogen water may be used.

In a preferred embodiment, primary polishing and secondary polishing are conducted in the same polishing unit. This constitution allows the polishing apparatus to be simplified and to reduce an installation space thereof.

In a preferred embodiment, the polishing section comprises at least two polishing units for performing primary polishing and secondary polishing, respectively. This constitution allows the processes to be simplified and contributes to improving throughput of the substrates.

In a preferred embodiment, the polishing section comprises at least two polishing units for the primary polishing process and the secondary polishing process, and the cleaning section comprises at least two cleaning units for performing different cleaning processes. This constitution allows two-stage cleaning or three-stage cleaning, and a plurality of cleaning processes can be performed by the single apparatus.

For example, in case of using an abrasive liquid containing alumina material, removal of particles in the secondary polishing process cannot be sufficiently performed. In performing the etching process after secondary polishing, scrubbing cleaning is carried out with alkali before the etching process to remove particles sufficiently. In this case, three-stage cleaning should be performed.

According to the polishing apparatus of the present invention, two-stage cleaning and the three-stage cleaning can be selectively performed. If the abrasive liquid and the polishing cloth are replaced in the polishing unit, then an optimum apparatus which is suitable for both the process which uses the abrasive liquid containing siliceous material and the process which uses the abrasive liquid containing alumina material may be constructed. Further, even if the scrubbing process becomes unnecessary due to progress in the polishing technology with use of the abrasive liquid containing alumina material and the cleaning technology after polishing, the present invention offers an optimum structure.

According to another aspect of the present invention, there is also provided a polishing method for polishing and then cleaning a substrate, the method comprising: polishing the substrate primarily by pressing the substrate against a polishing surface; polishing the substrate secondarily at a polishing rate lower than the primary polishing; cleaning the substrate which has been polished to remove particles attached to the substrate by scrubbing cleaning, and removing metal ions from the substrate by supplying an etching liquid; and drying the substrate after removing the metal ions therefrom.

In a preferred embodiment, the etching liquid comprises acid aqueous solution containing hydrofluoric acid.

According to another aspect of the present invention, a cleaning apparatus for cleaning a substrate which has been polished comprises: at least two primary cleaning units having the same cleaning function, each for primarily cleaning the substrate which has been polished; and a common secondary cleaning unit for secondarily cleaning the substrate which has been cleaned by the primary cleaning units.

With the above arrangement, the primary cleaning of the substrates is conducted in parallel in the primary cleaning units simultaneously or with a certain time lag, and then secondary cleaning of the substrates which have been primarily cleaned is conducted in a common secondary cleaning unit. This arrangement is desirable for such a case where primary cleaning requires a time longer than secondary cleaning.

According to another aspect of the present invention, a cleaning apparatus for cleaning a substrate which has been polished comprises: at least three cleaning units for cleaning the substrate which has been polished; and a transfer robot for transferring the substrate between at least two of the cleaning units; wherein the substrate is cleaned by selective cleaning processes conducted by any two or three cleaning units selected from the at least three cleaning units.

With the above arrangement, any two or three cleaning units are selected from at least three cleaning units to conduct selective cleaning processes of the substrates. The selective cleaning processes include two-stage cleaning of the substrate or three-stage cleaning of the substrate.

According to another aspect of the present invention, a polishing apparatus for polishing and then cleaning a substrate comprises: a plurality of polishing units for polishing the substrate; and a plurality of cleaning units for cleaning the substrate which has been polished; wherein the substrates are processed by different processes through a plurality of polishing-cleaning routes, each including at least one selected from the polishing units and at least one selected from the cleaning units.

With the above arrangement, at least one selected from a plurality of polishing units and at least one selected from a plurality of cleaning units can be combined to construct a polishing-cleaning route, and the number of polishing-cleaning routes can be freely selected by setting the number of polishing units and cleaning units appropriately, and hence a plurality of different processes can be selectively conducted on the substrates.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

A polishing apparatus according to the present invention will be described with reference to drawings.

Figure 1:
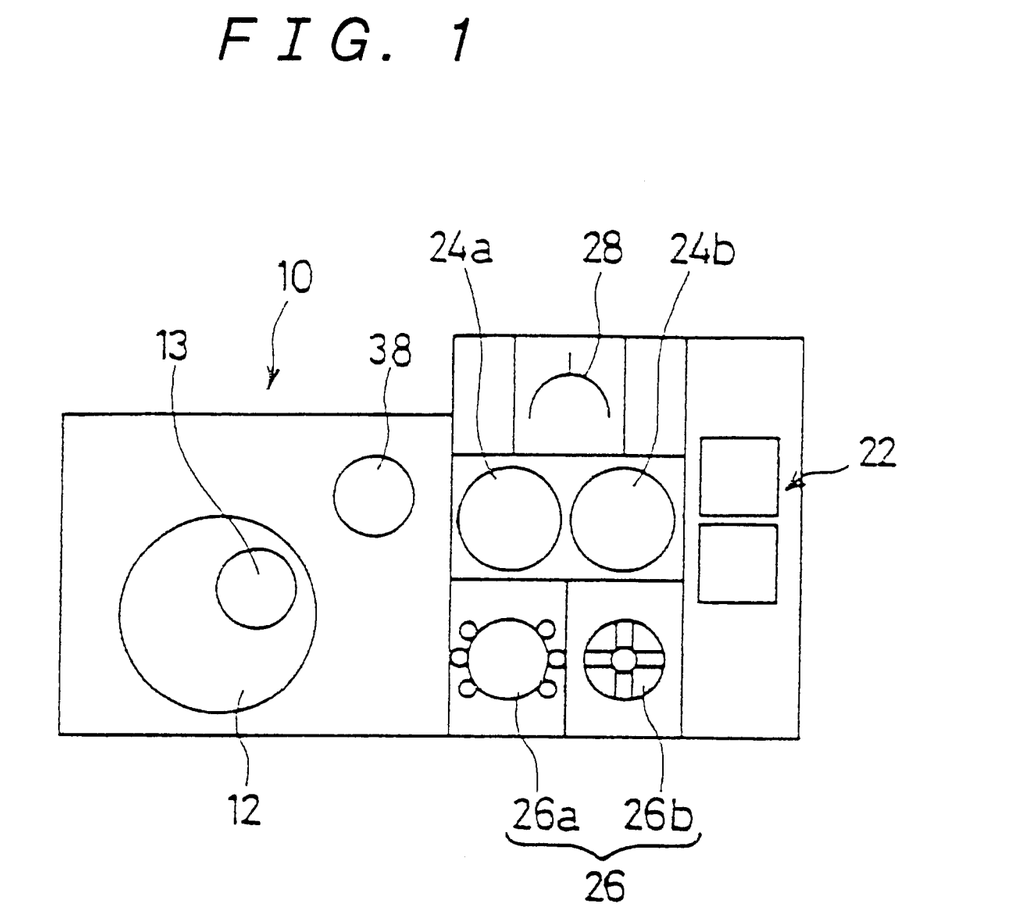
FIG. 1 is a plan view of a polishing apparatus according to a first embodiment of the present invention.

FIGS. 1 through 5B show a polishing apparatus according to a first embodiment of the present invention. As shown in FIG. 1, the polishing apparatus comprises a polishing section 10 having one polishing unit, and a cleaning section 26 having two transfer robots 24a and 24b and two cleaning units 26a and 26b. The polishing section 10 and the transfer robots 24a and 24b have the same structure as the conventional ones. The polishing cloth 11 on the turntable 12 constitutes a polishing surface. The polishing section 10 and the cleaning units 26a and 26b are partitioned by respective partition walls, and are evacuated independently to prevent respective atmospheres from being mixed.

Figure 3A:
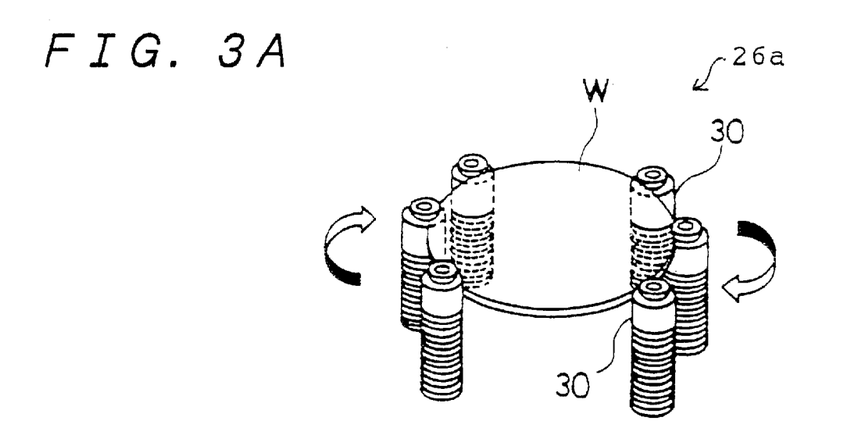
FIG. 3A is a perspective view of a primary cleaning unit in the polishing apparatus according to the first embodiment of the present invention.
Figure 3B:
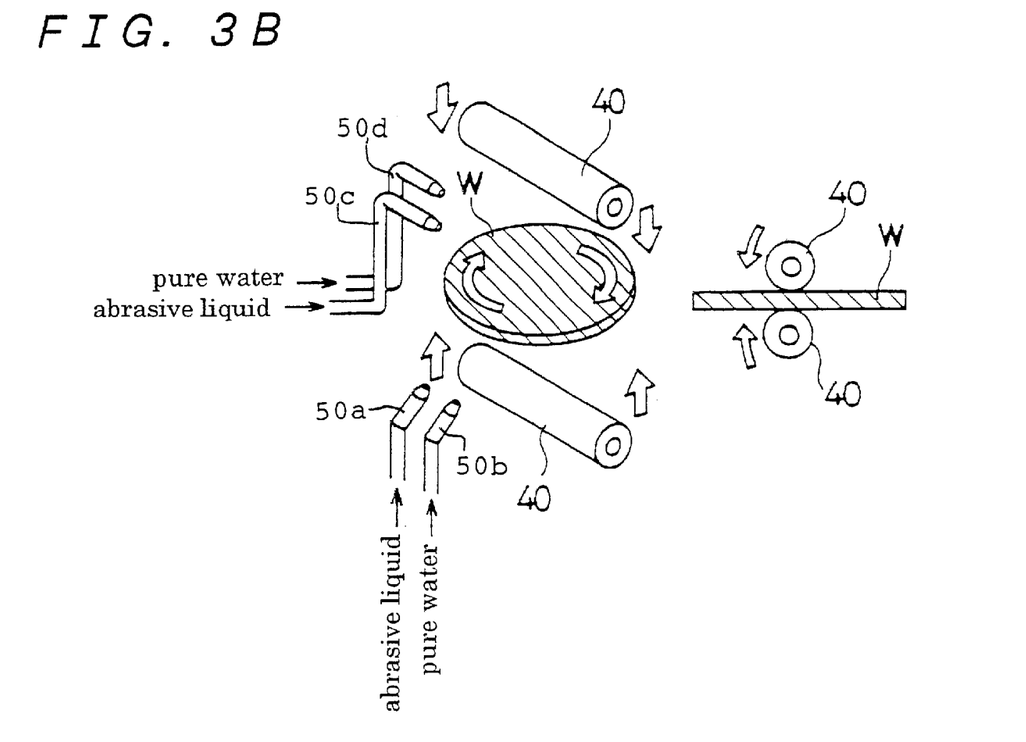
FIG. 3B is a perspective view showing the operation of the primary cleaning unit.

As shown in FIGS. 3A and 3B, the primary cleaning unit 26a in the cleaning section 26 includes six vertical spindles 30 that are arranged at spaced intervals along a circle for supporting the outer circumferential edge of a semiconductor substrate W and rotating the semiconductor substrate W in a horizontal plane at a relatively low rotational speed, and a pair of roller type cleaning members 40 made of sponge, PVA or the like and extending horizontally diametrically above and below the semiconductor substrate W. The vertical spindles 30 are movable horizontally toward and away from the semiconductor substrate W. The cleaning members 40 can be brought in contact with the semiconductor substrate W or out of contact with the semiconductor substrate W. The primary cleaning unit 26a is a roll and low rotational speed type cleaning unit. In the primary cleaning unit 26a, there are provided nozzles 50a, 50b, 50c and 50d for supplying an etching liquid and pure water to the upper and lower surfaces of the semiconductor substrate W.

Figure 5A:
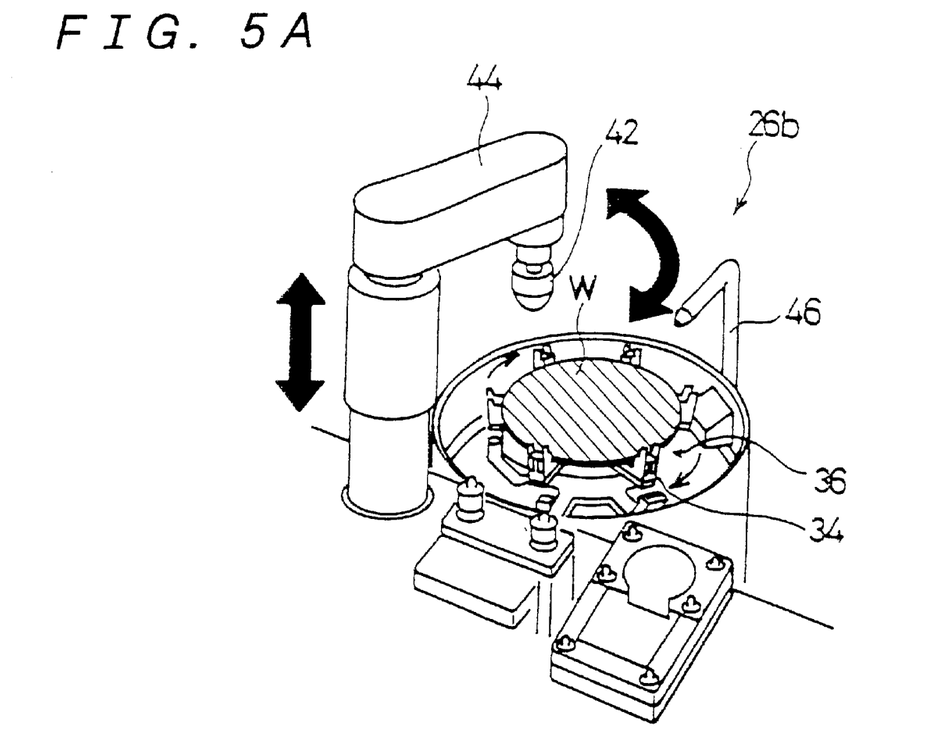
FIG. 5A is a perspective view of a secondary cleaning unit in the polishing apparatus according to the first embodiment of the present invention.
Figure 5B:
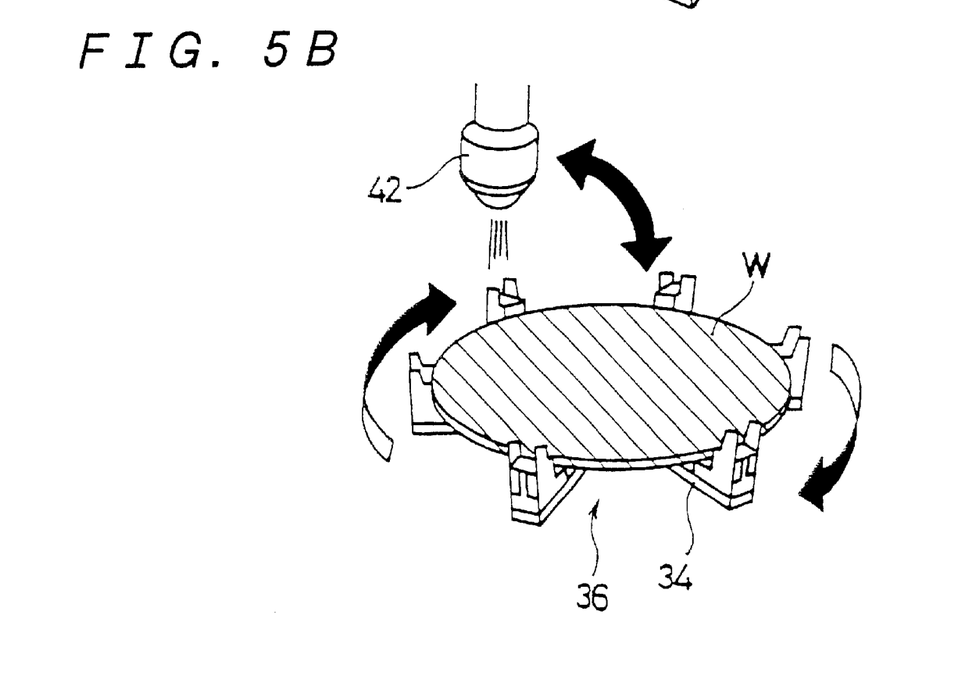
FIG. 5B is a perspective view showing the operation of the second cleaning unit.

As shown in FIGS. 5A and 5B, the secondary cleaning unit 26b comprises a rotating table 36 for rotating the semiconductor substrate W at a high rotational speed of 1,500 to 5,000 rpm, and a swing arm 44 having a nozzle 42 for supplying a cleaning liquid to which ultrasonic vibration is applied to the upper surface of the semiconductor substrate W. The secondary cleaning unit 26b is a megasonic and high rotational speed type cleaning unit. The secondary cleaning unit 26b may include a nozzle 46 for supplying an inert gas to the surface of the semiconductor substrate W or a heater for speeding up drying of the semiconductor substrate W to improve process performance and shorten tact time. Further, the secondary cleaning unit 26b may include a nozzle for supplying a cleaning liquid to the lower surface of the semiconductor substrate W. In this embodiment, although noncontact type cleaning is performed by supplying the cleaning liquid to which ultrasonic vibration is applied by an ultrasonic vibration generating device (not shown) from the nozzle 42 to the semiconductor substrate W, a pencil type cleaning member made of sponge or the like may replace the nozzle 42 or may be added in addition to the nozzle 42 to perform contact type cleaning.

Next, the operation of the polishing apparatus having the above structure will be described with reference to FIG. 2.

The semiconductor substrate W is transported from the load and unload section 22 to the polishing section 10 via the reversing device 28 and the transfer device 38 by the transfer robots 24a and 24b as shown by the arrows ①, ② and ③. In the polishing section 10, the semiconductor substrate W is held by the lower surface of the top ring 13 and pressed against the polishing cloth 11 on the turntable 12. At this time, the normal abrasive liquid is used to polish the semiconductor substrate W. This polishing process is referred to as "normal polishing" or "main polishing". Thereafter, a water polishing process is conducted in the polishing section 10. In this water polishing process, pure water is used as a polishing liquid and the semiconductor substrate is polished under a polishing pressure and/or a polishing rate which are smaller than those of normal polishing. In case of polishing a $SiO_2$ layer on the semiconductor substrate, the polishing rate in the water polishing process is preferably 100 Å (angstrom)/minute or below, and microscratches on the polished surface of the semiconductor substrate W formed in the normal polishing are removed or reduced, and the ground-off particles and the abrasive particles remaining on the polished surface are removed. Thus, the water polishing process is so-called "finish polishing process". This finish polishing process may be performed using a polishing liquid containing abrasive particles smaller than the abrasive particles used in the normal polishing process, or chemicals instead of the water polishing process, or between the normal polishing process and the water polishing process. However, although the finish polishing process is performed on the same turntable as the normal polishing process in this embodiment, finish polishing may be conducted by a discrete turntable.

Since the abrasive liquid containing the abrasive particles remains on the polishing cloth 11 immediately after the normal polishing process, it is necessary to supply a certain amount of pure water to the polishing cloth 11 to remove the abrasive liquid therefrom. In this case, if a large amount of pure water is rapidly supplied to the polishing cloth 11 to dilute the abrasive liquid, then the pH of the abrasive liquid remaining on the polished surface of the semiconductor substrate and the polishing cloth 11 is rapidly changed to cause the abrasive particles to be aggregated due to pH shock. Therefore, it is desirable that a small amount of pure water is first supplied, and the supply of pure water is gradually increased. Incidentally, in the present invention, the particles aggregated on the polished surface of the semiconductor substrate will be removed in the finish polishing process described below, and thus a serious problem does not arise.

Figure 4A:
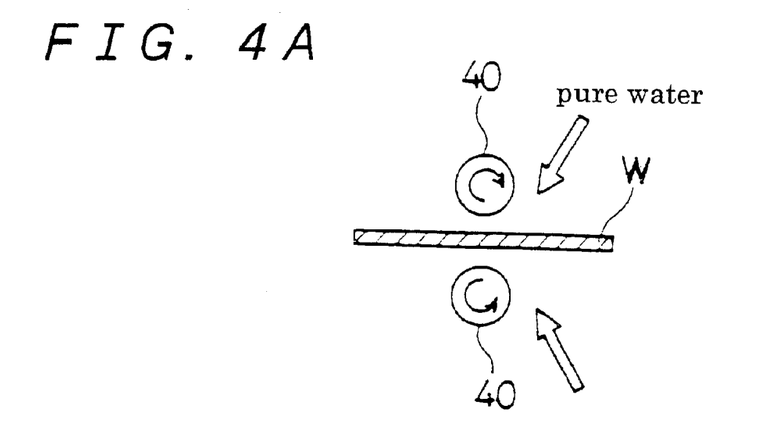
FIGS. 4A, 4B and 4C are schematic views showing cleaning processes in the primary cleaning unit.

After normal polishing and water polishing are applied to the semiconductor substrate W in the polishing section 10, the particles attached to the semiconductor substrate W are mostly removed to allow the semiconductor substrate W to have enhance and a degree of cleanliness. Thereafter, the semiconductor substrate W is transported to the primary cleaning unit 26a via the transfer device 38 as shown by the arrows ④ and ⑤ by the transfer robot 24a. As shown in the FIG. 3A, in the primary cleaning unit 26a, the semiconductor substrate W is held by the spindles 30. The semiconductor substrate W may be rotated at a low rotational speed of several 10 rpm to 300 rpm by the spindles 30. In the primary cleaning unit 26a, as shown in FIGS. 3B and 4A, scrubbing cleaning of the upper and lower surfaces of the semiconductor substrate W is performed by rotating the cleaning members 40 about their own axes while supplying pure water from the nozzles to the surfaces of the semiconductor substrate W.

Figure 4B:
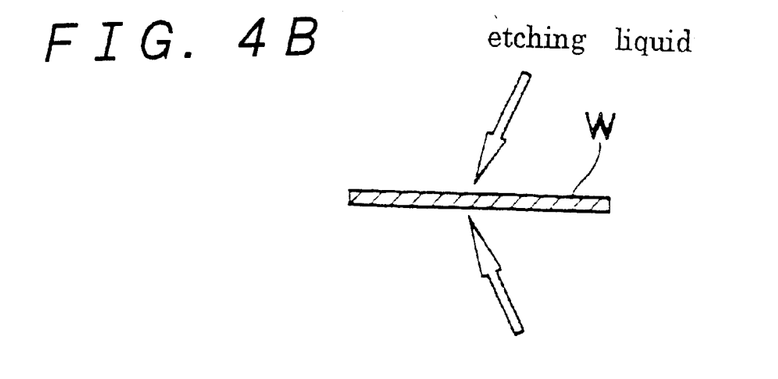
Figure 4C:
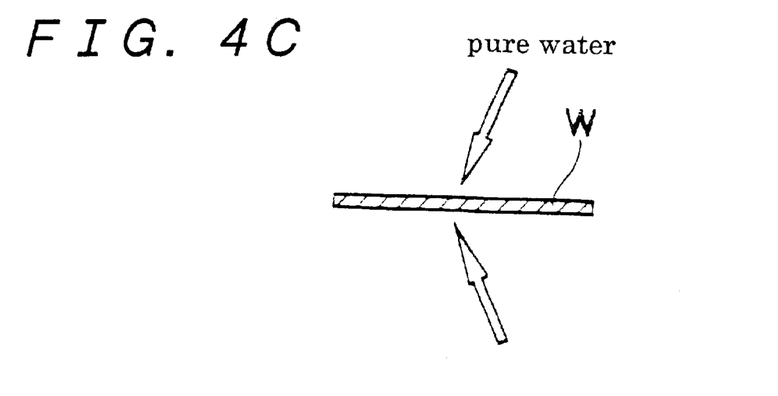

Next, as shown in FIG. 4B, after the cleaning members 40 are moved away from the semiconductor substrate W, etching liquid is supplied to the upper and lower surfaces of the semiconductor substrate W from the nozzles while the rotational speed of the semiconductor substrate W is being changed as necessary. Thus, metal ions remaining on the semiconductor substrate W are removed by etching (chemical cleaning) of the surfaces of the semiconductor substrate W. Thereafter, as shown in FIG. 4C, pure water is supplied from the pure water nozzles, and the etching liquid is removed by replacing the etching liquid with pure water while the rotational speed of the semiconductor substrate W is being changed as necessary. After completing replacement of the etching liquid with pure water, the semiconductor substrate W is transported to the reversing device 28, reversed to direct the polished surface upwardly, and then transported to the secondary cleaning unit 26b by the transfer robots 24a and 24b as shown by the arrows ⑥ and ⑦ in FIG. 2. In the secondary cleaning unit 26b, as shown in FIGS. 5A and 5B, while the semiconductor substrate W is rotated at a low rotational speed of 100 to 500 rpm, the swing arm 44 is swung over the entire surface of the semiconductor substrate W while pure water to which ultrasonic vibration is applied is supplied from the nozzle 42 provided at the forward end of the swing arm 44 to the upper surface of the semiconductor substrate W so as to allow the supplied pure water to pass through the center of the semiconductor substrate w, thereby removing particles from the semiconductor substrate W. Thereafter, the supply of pure water is stopped, the swing arm 44 is moved to the standby position, and then the semiconductor substrate W is rotated at a high rotational speed of 150 to 5,000 rpm to dry the semiconductor substrate W while supplying an inert gas as necessary. The semiconductor substrate W which has been dried is returned to a wafer cassette 22a or 22b placed on the load and unload section 22 by the transfer robot 24b as shown by the arrow ⑧ in FIG. 2.

Figure 2:
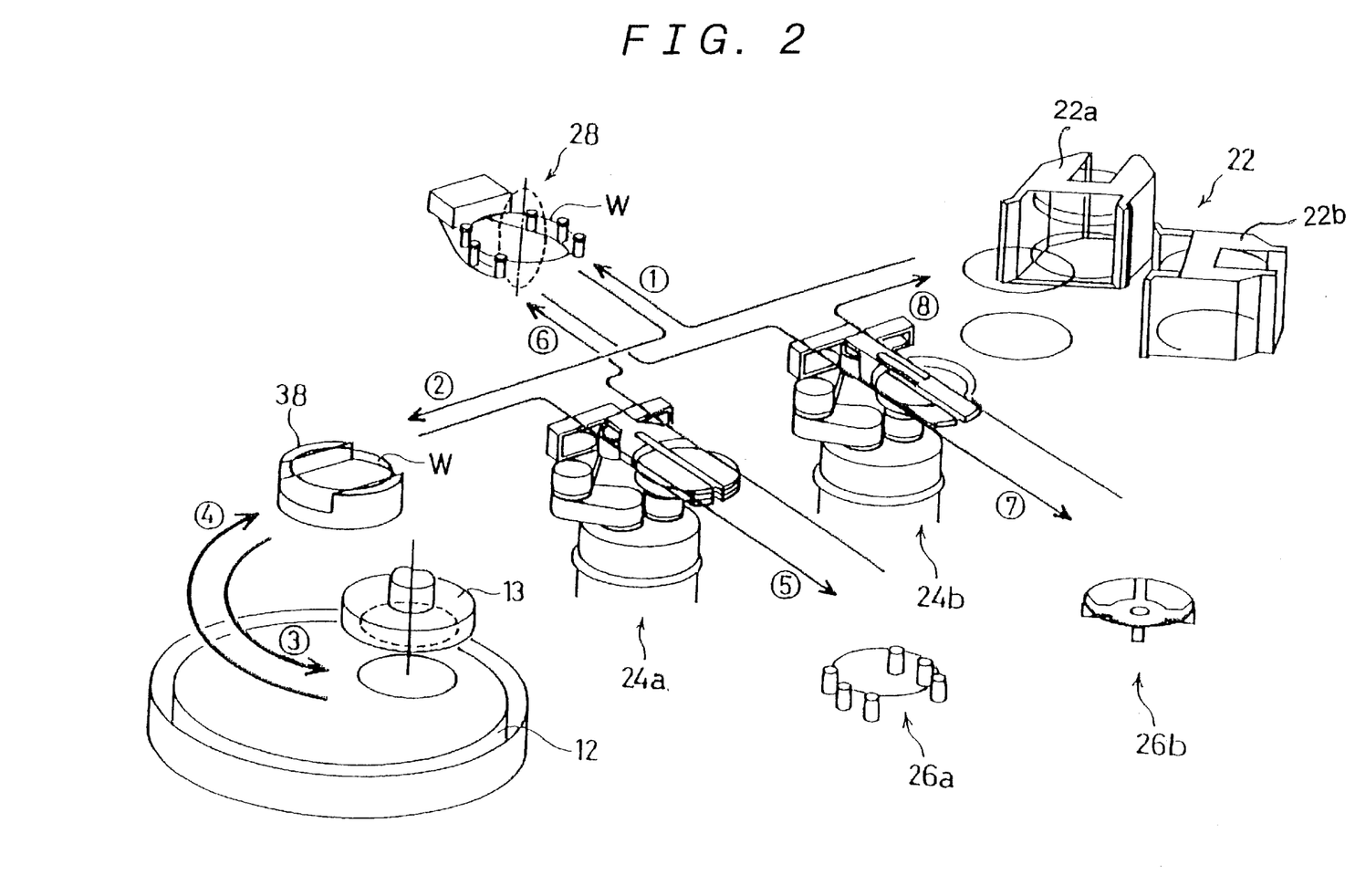
FIG. 2 is a perspective view showing the whole structure of the polishing apparatus and a transportation route of a semiconductor substrate according to the first embodiment to the present invention.

In the above polishing and cleaning processes, the number of the cleaning units in the cleaning section 26 is reduced from three units to two units, and the number of times of transporting the semiconductor substrate W is also reduced from nine as shown in FIG. 11 to eight as shown in FIG. 2. Thus, the total processing time is greatly shortened. Further, since the transportation route of the semiconductor substrate W is simplified, the chance of interference of the transfer robots 24a and 24b with each other is decreased, and control of the transfer robots 24a and 24b is facilitated.

The structure of the cleaning units 26a and 26b is not limited to the above-mentioned structure, and, for example, the cleaning member 40 may comprise a brush or a felt-like fiber, or the cleaning liquid may be a cleaning liquid to which cavitation is applied, or minute particles of ice. The number of the cleaning units 26a and 26b is set to an optimum number in consideration of tact time in the respective cleaning units.

Figure 6:
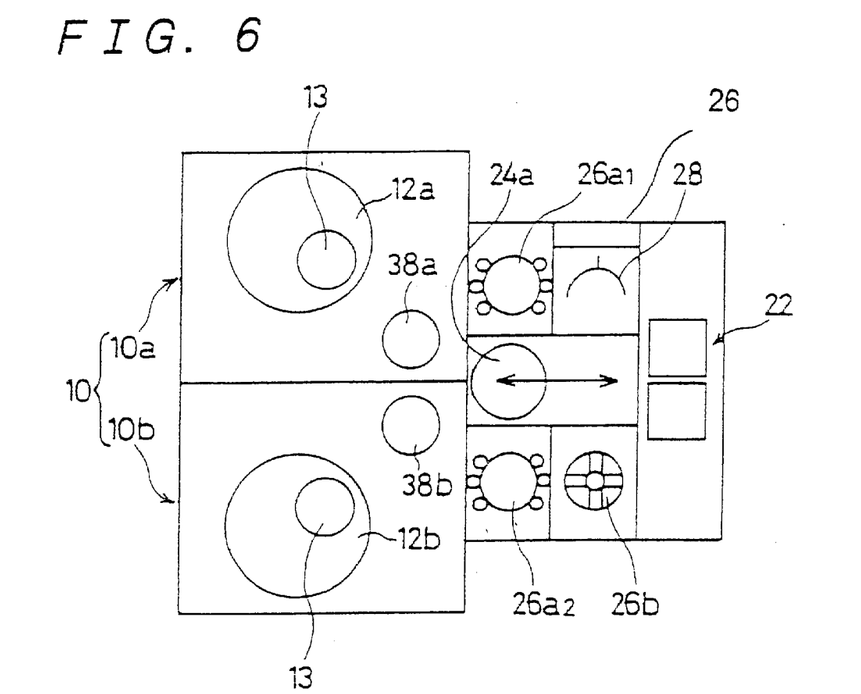
FIG. 6 is a plan view of a polishing apparatus according to a second embodiment of the present invention.

FIG. 6 shows a polishing apparatus according to a second embodiment of the present invention. As shown in FIG. 6, two polishing units 10a and 10b having the same structure as the polishing unit in FIG. 1 are provided in the polishing section 10, and one transfer robot 24a which moves along rails is provided. The two polishing units 10a and 10b are disposed symmetrically with respect to the moving path of the transfer robot 24a. In the cleaning section 26, primary cleaning units $26a_1$ and $26a_2$ which have the same cleaning function and the same structure are provided so as to correspond to the respective polishing units 10a and 10b, and one secondary cleaning unit 26b is provided. Other structure of the polishing apparatus shown in FIG. 6 is substantially the same as that of the polishing apparatus shown in FIG. 1.

According to this embodiment, a parallel processing in which the semiconductor substrates W are polished by the polishing units 10a and 10b in parallel and a serial processing in which one semiconductor substrate W is polished sequentially by the polishing units 10a and 10b can be performed.

In parallel processing, the normal polishing and the water polishing are conducted in the polishing units 10a and 10b, respectively, with a certain time lag, to thereby perform efficient transfer of the semiconductor substrates W by the transfer robot 24a. The operating efficiency in the transfer robots and the cleaning section is not high in the polishing apparatus of FIG. 1, but the operating efficiency in the transfer robot 24a and the cleaning section 26 is high in the polishing apparatus of FIG. 6 because there are provided the two polishing units 10a and 10b. Thus, the throughput per unit area of floor occupied by the overall polishing apparatus can be improved. Further, since the primary cleaning units $26a_1$ and $26a_2$ are provided so as to correspond to the respective polishing units 10a and 10b, operational delay in the cleaning section 26 can be prevented.

In serial processing, the normal polishing of the semiconductor substrate W is performed in the polishing unit 10a, and then the polished semiconductor substrate W is transferred to the polishing unit 10b in which the water polishing is performed. If the problem of contamination of the semiconductor substrate does not arise, then the normal polishing of the semiconductor substrate W is conducted in the polishing unit 10a, and then the polished semiconductor substrate W is transferred to the polishing unit 10b by the transfer robot 24a. If the problem of contamination of the semiconductor substrate arises, then the normal polishing of the semiconductor substrate W is conducted in the polishing unit 10a, the polished semiconductor substrate W is transferred to the primary cleaning unit $26a_1$, by the transfer robot 24a, in which it is cleaned. Thereafter, the cleaned semiconductor substrate W is transferred to the polishing unit 10b in which the finish polishing of the semiconductor substrate W is conducted. Further, in the primary cleaning unit $26a_1$, the semiconductor substrate W may be cleaned using chemicals suitable for the slurry (abrasive liquid) used in the polishing unit 10a.

In this second embodiment, two primary cleaning units $26a_1$ and $26a_2$ and one secondary cleaning unit 26b are provided. This is because the primary cleaning process takes more time than the secondary cleaning process. Thus, two primary cleaning units $26a_1$ and $26a_2$ are provided to improve efficiency, each for the polishing unit 10a and the polishing unit 10b, while the secondary cleaning unit 26b which needs a processing time shorter than the primary cleaning process is used in common for the substrates which are cleaned in both the primary cleaning units $26a_1$ and $26a_2$.

In the polishing apparatus of FIG. 1 or the above parallel processing, since the normal polishing and the water polishing are performed on the same turntable 12, the abrasive liquid and pure water on the polishing cloth 11 attached to the turntable 12 are replaced each time, and hence the loss of the processing time is caused and the consumption of the abrasive liquid or pure water is increased. However, in this serial processing, the normal polishing and the water polishing are performed on the turntables 12a and 12b, respectively, and hence the above problems can be avoided.

Figure 7:
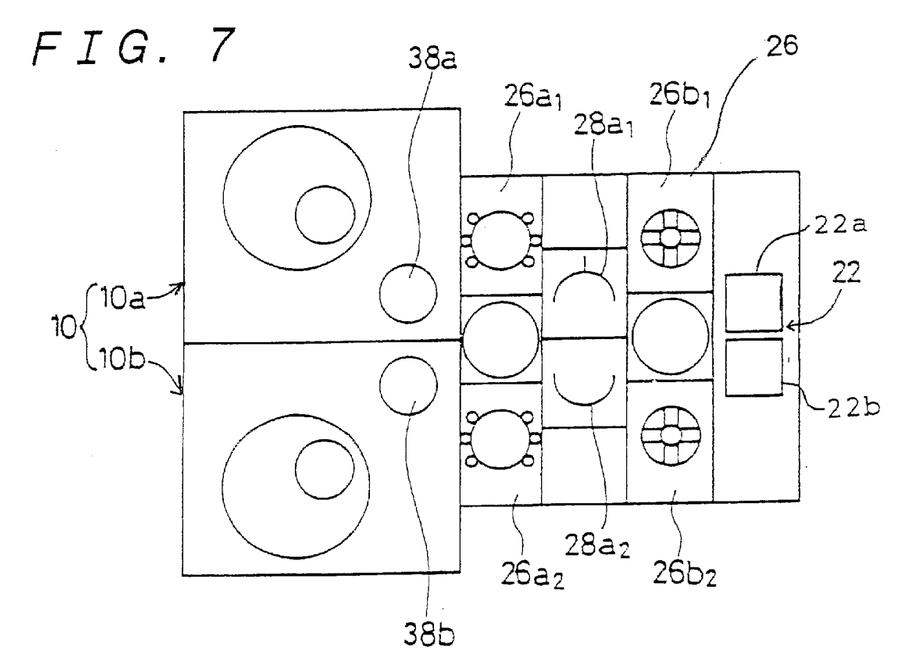
FIG. 7 is a plan view of a polishing apparatus according to a third embodiment of the present invention.

FIG. 7 shows a polishing apparatus according to a third embodiment of the present invention.

In the polishing apparatus of FIG. 7, the polishing section 10 has two polishing units 10a and 10b having the same structure as the polishing unit of FIG. 1. The polishing units 10a and 10b are symmetrically disposed in the same manner as the polishing apparatus of FIG. 6. In the cleaning section 26, primary cleaning units $26a_1$ and $26a_2$ having the same structure, secondary cleaning units $26b_1$ and $26b_2$ having the same structure, and reversing devices $28a_1$ and $28a_2$ are symmetrically disposed so as to correspond to the polishing units 10a and 10b, respectively. In the polishing apparatus of this embodiment also, parallel processing and serial processing can be conducted. In parallel processing, a first substrate processing line A in which the polishing process conducted by the polishing unit 10a, the primary cleaning process conducted by the primary cleaning unit $26a_1$, and the secondary cleaning process conducted by the secondary cleaning unit $26b_1$ are sequentially performed, and a second substrate processing line B in which the polishing process conducted by the polishing unit 10b, the primary cleaning process conducted by the primary cleaning unit $26a_2$ and the secondary cleaning process conducted by the secondary cleaning unit $26b_2$ are sequentially performed can be constructed. Therefore, parallel processing can be independently conducted without causing the two transfer lines of the semiconductor substrates W to intersect.

According to this embodiment, in addition to the above parallel processing operations, two parallel processing can be conducted. In the first parallel processing, the semiconductor substrates W taken out from one wafer cassette are alternately delivered to the respective polishing units 10a and 10b. This parallel processing allows the processing time of one wafer cassette to be halved. In the second parallel processing, the wafer cassette 22a is assigned exclusively to the first substrate processing line A, and another wafer cassette 22b is assigned exclusively to the second substrate processing line B. In this case, the semiconductor substrates W to be polished may be the same ones or different ones. Further, four wafer cassettes may be placed on the load and unload section 22 to thereby conduct continuous processing of the semiconductor substrates.

In the case where parallel processing is conducted using the first substrate processing line A and the second substrate processing line B in parallel, the first substrate processing line A and the second substrate processing line B may have their own processing units or devices, and hence two kinds of different processes can be performed in parallel in the polishing apparatus. Further, it is conceivable to incorporate a cleaning device using ultrasonic vibration in the second cleaning unit $26b_1$ and to incorporate a cleaning device using cavitation in the secondary cleaning unit $26b_2$. This structure allows the polishing apparatus to have versatile functions performed by two polishing apparatuses shown in FIG. 1.

Further, each of the cleaning units including the primary cleaning units $26a_1$ and $26a_2$, the secondary cleaning units $26b_1$ and $26b_2$ may be modulized, and may be separable from the polishing apparatus and replaceable. According to this structure, even after the polishing apparatus is installed, the polishing apparatus can comply with various required processes. Further, in the event of failure in the cleaning unit, or in case of maintenance of the cleaning unit, the down time of the polishing apparatus can be shortened to raise the operation rate thereof.

Figure 8:
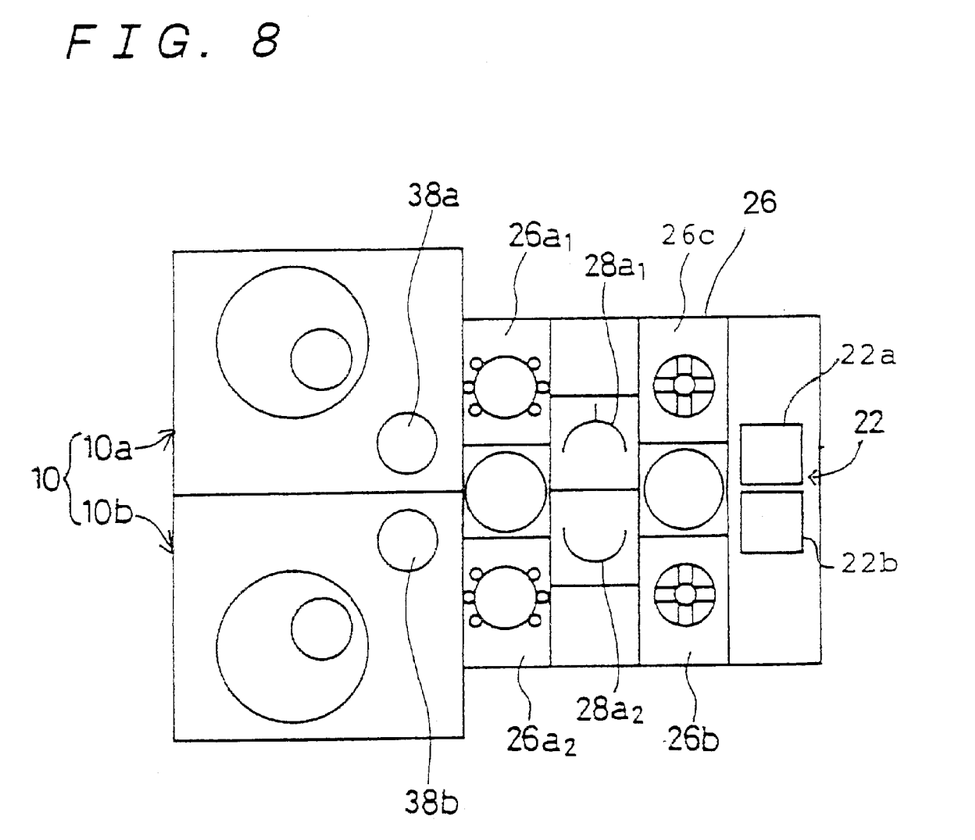
FIG. 8 is a plan view of a polishing apparatus according to a fourth embodiment of the present invention.

FIG. 8 shows a polishing apparatus according to a fourth embodiment of the present invention. As in the polishing apparatus of FIG. 7, the polishing section 10 comprises two polishing units 10a and 10b having the same structure as the polishing unit of FIG. 1, and the polishing units 10a and 10b are disposed symmetrically. In the cleaning section 26, there are provided primary cleaning units $26a_1$ and $26a_2$ which have same cleaning function and same structure, a secondary cleaning unit 26b and a tertiary cleaning unit 26c. Further, reversing devices $28a_1$ and $28a_2$ are symmetrically provided so as to correspond to the polishing units 10a and 10b, respectively.

The secondary cleaning unit 26b comprises a nozzle 42 for supplying a cleaning liquid to which ultrasonic vibration is applied to the semiconductor substrate W, and a cleaning member such as a pencil type sponge for scrubbing the semiconductor substrate W by bringing the cleaning member into contact with the semiconductor substrate W. That is, the secondary cleaning unit 26b is a pencil and megasonic and mechanical chuck type cleaning unit having a drying function. The tertiary cleaning unit 26c having a drying function comprises a cleaning member such as a pencil type sponge, and is a pencil and mechanical chuck type cleaning unit.

According to this embodiment, in addition to two-stage cleaning, the three-stage cleaning can be performed, and hence a plurality of cleaning methods can be conducted in the single polishing apparatus. To be more specific, with regard to the semiconductor substrate W which has been polished in the polishing unit 10a, the two-stage cleaning in which the primary cleaning process conducted by the primary cleaning unit $26a_1$, the secondary cleaning process conducted by the tertiary cleaning unit 26c, and the spin-drying process are performed sequentially, and three-stage cleaning in which the primary cleaning process conducted by the primary cleaning unit $26a_1$, the secondary cleaning process conducted by the secondary cleaning unit 26b, the tertiary cleaning process conducted by the tertiary cleaning unit 26c, and the spin-drying process are performed sequentially can be conducted. On the other hand, with regard to the semiconductor substrate W which has been polished in the polishing unit 10b, two-stage cleaning in which the primary cleaning process conducted by the primary cleaning unit $26a_2$, the secondary cleaning process conducted by the secondary cleaning unit 26b or the tertiary cleaning unit 26c, and the spin-drying process are performed sequentially, and the three-stage cleaning in which the primary cleaning process conducted by the primary cleaning unit $26a_2$, the secondary cleaning process conducted by the secondary cleaning unit 26b, the tertiary cleaning process conducted by the tertiary cleaning unit 26c, and the spin-drying process are performed sequentially can be conducted.

Further, the following polishing processes ① to ⑤ can be conducted. That is, one semiconductor substrate is processed in the following route.

① the primary cleaning unit 26a₁ or the primary cleaning unit 26a₂ (either one which is not used currently is used), → the secondary cleaning unit 26b→ the tertiary cleaning unit 26c (three-stage cleaning)

② the primary cleaning unit 26a₁→ the tertiary cleaning unit 26c→ the primary cleaning unit 26a₂→ the secondary cleaning unit 26b

③ the primary cleaning unit 26a₁→ the primary cleaning unit 26a₂→ the secondary cleaning unit 26b→ the tertiary cleaning unit 26c

④ two-stage polishing (for example, the polishing unit 10a→ the polishing unit 10b)→ the primary cleaning unit 26a₁→ the tertiary cleaning unit 26c or the primary cleaning unit 26a₂→ the secondary cleaning unit 26b (in this case, the cleaning route in which high throughput is obtained is selected)

⑤ the primary polishing in the polishing unit 10a→ the primary cleaning unit 26a₁→ the secondary cleaning in the polishing unit 10b→ the primary cleaning unit 26a₂→ the secondary cleaning unit 26b→ the tertiary cleaning unit 26c (three-stage cleaning)

As described above, depending on the polishing time, cleaning time, or the kind of the semiconductor substrate, the cleaning process can be selected to achieve optimum characteristics of the polished surface of the semiconductor substrate and also high throughput.

According to this embodiment, four cleaning units which perform three different kinds of cleaning processes are used to perform two-stage cleaning or three-stage cleaning. However, four cleaning units which perform four kinds of different cleaning processes, or more cleaning units may be used to perform four-stage cleaning. In those cases, a plurality of cleaning units which perform different cleaning processes may be modularized, and may be separable from the polishing apparatus and replaceable to thereby comply with various processes.

Figure 9:
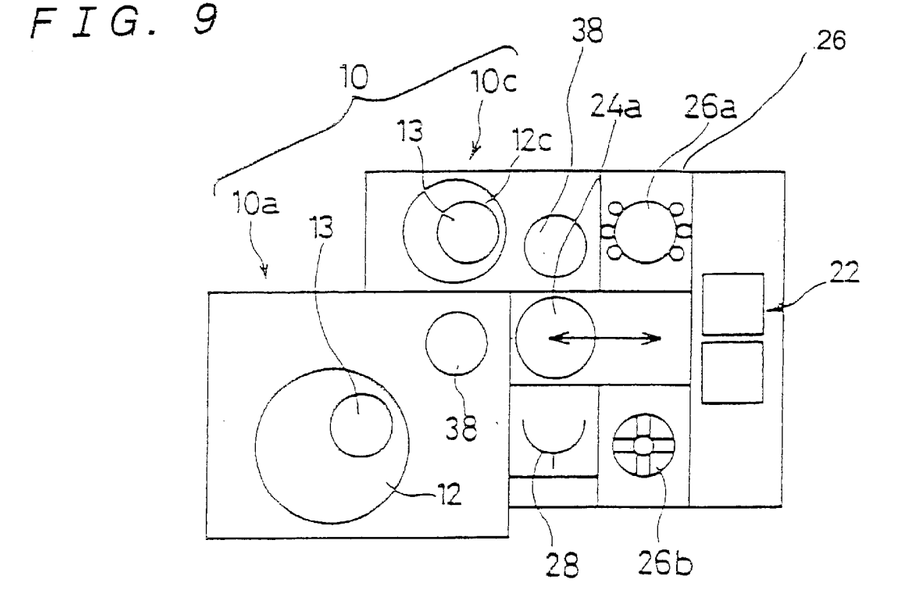
FIG. 9 is a plan view of a polishing apparatus according to a fifth embodiment of the present invention.

FIG. 9 shows a polishing apparatus according to a fifth embodiment of the present invention. In the polishing section 10, in addition to the polishing unit 10a which performs normal polishing, a small-sized finish polishing unit 10c which performs water polishing is provided. The finish polishing unit 10c has a finish polishing table 12c having a diameter slightly larger than the semiconductor substrate W to be polished. The finish polishing table 12c does not rotate about its own axis, but performs a circulatory translational motion in a horizontal plane. This circulatory translational motion is referred to as "orbital motion" or "scroll motion". This circulatory translational motion is achieved by a structure in which a driving end provided eccentrically at an upper end of a driving shaft of a motor is accommodated in a recess formed in a lower surface of the finish polishing table through a bearing, and the rotation of the finish polishing table about its own axis is mechanically restrained. Further, since the water polishing time is shorter than the normal polishing time, in addition to the polishing unit shown in FIG. 9, a polishing unit which performs a second normal polishing may be provided to thereby achieve further high throughput.

For the finish polishing table 12c, a material softer than the normal polishing cloth is preferably used. Examples of the polishing cloth which are commercially available are nonwoven fabric cloth made of polyester, and Politex, Suba 800 and IC-1000 manufactured by Rodel Products Corporation, and Surfin xxx-5 and Surfin 000 manufactured by Fujimi Inc. The polishing cloth sold under the tradenames Suba 800, Surfin xxx-5, and Surfin 000 is made of nonwoven fabric composed of fibers bound together by urethane resin, and the polishing cloth sold under the tradename IC-1000 is made of polyurethane.

Examples of a wiping cloth which are commercially available are Miracle Series (tradename) sold by Toray Industries, Inc., and Minimax (tradename) sold by Kanebo, Ltd. These wiping cloth have a number of fibers, having a diameter of 1 to 2 $\mu$m, of 15,500–31,000/cm² (a hundred thousand to two hundred thousand per in²) in a high density manner, and have a large number of contacting points contacting the object to be wiped, and thus have an excellent ability for wiping fine particles. Since the wiping cloth is a thin cloth, it is desirable that the wiping cloth is attached to the polishing table through a cushioning member such as a sponge or a rubber so as not to damage the semiconductor substrate during finish polishing.

As a condition of water polishing process in the polishing table 12c, the polishing pressure is 0–200 g/cm², the relative speed between the polishing table and the semiconductor substrate is 0.07–0.6 m/sec, and the processing time is 10–120 second.

According to this embodiment, the polishing apparatus offers throughput higher than that of the polishing apparatus of FIG. 1, and occupies an installation floor area smaller than that of the polishing apparatus of FIG. 6. Further, since the finish polishing unit 10c for exclusively performing water polishing is provided, the polishing apparatus has an excellent finish processing capability in which there will be few scratches and few particles on the polished surface of the semiconductor substrate. The cloth for finish polishing (water polishing) attached to the finish polishing table 12c may be applied to the polishing unit 10b which is used for water polishing in serial processing in FIG. 6.

Although the method and apparatus for polishing a $SiO_2$ layer on the semiconductor substrate W has been described in the above embodiments, the present invention is not limited to those embodiments. For example, when polishing a metal layer such as a CU layer, diluted hydrofluoric acid or an acid aqueous solution containing HCl may be used as an etching liquid in the primary cleaning unit.

As is apparent from the above description, according to the present invention, since the semiconductor substrates W are cleaned and dried by the two cleaning units, the processing time can be shortened and the cost of the polishing apparatus can be reduced, compared with the conventional apparatus. Further, since the number of times of transporting the semiconductor substrate is reduced, the processes are simplified and the chance of contamination of the semiconductor substrate is reduced. Therefore, the processing time is shortened and a semiconductor substrate having a high degree of cleanliness may be obtained by a small-sized apparatus.

Although certain preferred embodiments of the present invention have been shown and described in detail, it should be understood that various changes and modifications may be made therein without departing from the scope of the appended claims.

What is claimed is:

1. A polishing apparatus for polishing and then cleaning a substrate, said apparatus comprising:

a polishing section to polish a substrate by pressing the substrate against a polishing surface, to thus form a polished substrate having particles attached thereto;

a primary cleaning unit including a first system to supply water to the polished substrate to perform scrubbing cleaning to clean the polished substrate and to remove therefrom the particles attached thereto, and also including a second system to supply to the polished substrate an etching liquid to remove metal ions from the polished substrate; and a secondary cleaning unit to supply water to the polished substrate to clean the polished substrate and to spin-dry the substrate, to thus complete all of the cleaning of the polished substrate.

2. An apparatus as claimed in claim 1, wherein said polishing section includes a polishing unit to perform therein a primary polishing operation and a secondary polishing operation.

3. The polishing apparatus according to claim 2, wherein said polishing section comprises only a single polishing unit.

4. An apparatus as claimed in claim 1, wherein said polishing section includes two polishing units to perform primary polishing and secondary polishing.

5. An apparatus as claimed in claim 1, wherein said polishing section includes at least two polishing units to respectively perform a primary polishing operation and a secondary polishing operation.

6. An apparatus as claimed in claim 1, wherein said polishing section includes at least two polishing units to perform primary polishing and secondary polishing, and said primary cleaning unit and said secondary cleaning unit comprise two cleaning stations to perform different cleaning processes.

7. An apparatus as claimed in claim 1, wherein at least said secondary cleaning unit includes a rotating mechanism to rotate the substrate at a rotational speed.

8. An apparatus according to claim 1, wherein said first system includes a water supply nozzle and said second system comprises an etching liquid supply nozzle.

9. An apparatus according to claim 8, wherein said water supply nozzle is adjacent to said etching liquid supply nozzle.

10. A method for polishing and then cleaning a substrate, said method comprising:

polishing the substrate by pressing the substrate against a polishing surface, to thus form a polished substrate having particles attached thereto;

cleaning the polished substrate in a cleaning unit by performing scrubbing cleaning to remove the particles therefrom, and removing from the substrate metal ions by supplying an etching liquid to the substrate; and drying the substrate after said removing said metal ions therefrom.

11. A method as claimed in claim 10, wherein said etching liquid comprises an acidic aqueous solution containing hydrofluoric acid.

12. A method as claimed in claim 10, wherein said polishing by pressing the substrate against said polishing surface comprises a primary polishing operation, and further comprising performing a secondary polishing operation at a polishing rate lower than that of said primary polishing operation.

13. A polishing apparatus for polishing and then cleaning a substrate, said apparatus comprising:

a polishing section to polish a substrate by pressing the substrate against polishing surface, to thus form a polished substrate having particles attached thereto;

a primary cleaning unit to perform scrubbing cleaning to clean the polished substrate and to remove therefrom the particles attached thereto, and to supply to the polished substrate an etching liquid to remove metal ions from the polished substrate, wherein said primary cleaning unit comprises an etching liquid supply system, and a scrub member to scrub the polished substrate by contacting the polished substrate; and a secondary cleaning unit to supply water to the polished substrate to clean the polished substrate and to spin-dry the substrate, to thus complete all of the cleaning of the polished substrate.

14. An apparatus according to claim 13, wherein said primary cleaning unit includes a water supply nozzle to supply water to the substrate while performing scrubbing cleaning of the substrate, and said etching supply system includes an etching liquid supply nozzle to supply the etching liquid to the substrate.

15. An apparatus according to claim 14, wherein said water supply nozzle is adjacent to said etching liquid supply nozzle.

* * * * *